US011152278B2

(12) United States Patent
Zou et al.

(10) Patent No.: US 11,152,278 B2
(45) Date of Patent: Oct. 19, 2021

(54) HEAT SINK, INTEGRATED CIRCUIT CHIP AND CIRCUIT BOARD

(71) Applicant: Bitmain Technologies Inc., Beijing (CN)

(72) Inventors: Tong Zou, Beijing (CN); Micree Zhan, Beijing (CN); Wenjie Cheng, Beijing (CN)

(73) Assignee: Bitmain Technologies Inc., Beijing (CN)

( * ) Notice: Subject to any disclaimer, the term of this patent is extended or adjusted under 35 U.S.C. 154(b) by 0 days.

(21) Appl. No.: 16/842,906

(22) Filed: Apr. 8, 2020

(65) Prior Publication Data

US 2020/0235031 A1 Jul. 23, 2020

Related U.S. Application Data

(63) Continuation of application No. PCT/CN2018/109421, filed on Oct. 9, 2018.

(30) Foreign Application Priority Data

Oct. 10, 2017 (CN) .......................... 201710936285.3

(51) Int. Cl.
*H01L 23/367* (2006.01)
*H01L 23/373* (2006.01)
*H01L 25/065* (2006.01)

(52) U.S. Cl.
CPC ...... *H01L 23/3672* (2013.01); *H01L 23/3736* (2013.01); *H01L 25/0655* (2013.01)

(58) Field of Classification Search
CPC .............. H01L 23/367; H01L 23/3672; H01L 23/3675; H01L 23/3736; H01L 25/0655
See application file for complete search history.

(56) References Cited

U.S. PATENT DOCUMENTS

| 5,844,310 | A | * | 12/1998 | Okikawa | ............. | H01L 23/3733 257/712 |
| 6,501,655 | B1 | * | 12/2002 | Lee | ..................... | H01L 23/3672 165/80.3 |
| 6,625,021 | B1 | | 9/2003 | Lofland et al. | | |
| 2003/0209802 | A1 | | 11/2003 | Awano | | |
| 2005/0034841 | A1 | | 2/2005 | Barr et al. | | |

(Continued)

FOREIGN PATENT DOCUMENTS

| CN | 103021877 A | 4/2013 |
| CN | 104180350 A | 12/2014 |

(Continued)

OTHER PUBLICATIONS

Russian Office Action dated Jan. 10, 2020, in connection with corresponding RU Application No. 2020114361 (10 pp., including machine-generated English translation).

(Continued)

*Primary Examiner* — Allan R Wilson
(74) *Attorney, Agent, or Firm* — Maier & Maier, PLLC

(57) ABSTRACT

A heat sink for an integrated circuit chip. The heat sink includes a base plate and a plurality of fins connected to the base plate. The base plate includes a first segment, a second segment, and a third segment that are sequentially connected; and the first segment and the third segment extend obliquely upward relative to the second segment.

16 Claims, 6 Drawing Sheets

(56) References Cited

U.S. PATENT DOCUMENTS

| | | |
|---|---|---|
| 2006/0237517 A1 | 10/2006 | Lee |
| 2007/0091578 A1 | 4/2007 | Chang et al. |
| 2007/0297155 A1 | 12/2007 | Hebel et al. |
| 2009/0321048 A1* | 12/2009 | Liu .................... H01L 23/4093 165/80.3 |
| 2010/0008042 A1* | 1/2010 | Xu ....................... H01L 23/367 361/697 |
| 2010/0059203 A1* | 3/2010 | Chu ......................... G06F 1/20 165/80.3 |
| 2017/0164520 A1 | 6/2017 | Barron et al. |

FOREIGN PATENT DOCUMENTS

| | | |
|---|---|---|
| CN | 204668293 U | 9/2015 |
| CN | 106413343 A | 2/2017 |
| CN | 107507813 A | 12/2017 |
| CN | 108550559 A | 9/2018 |
| RU | 2191445 C2 | 10/2002 |
| RU | 71478 U1 | 3/2008 |
| RU | 2410793 C2 | 1/2011 |
| WO | 2007/115371 A1 | 10/2007 |

OTHER PUBLICATIONS

International Search Report and Written Opinion of the International Searching Authority dated Jan. 9, 2019 in corresponding International application No. PCT/CN2018/109421; 11 pages.
Canadian Office Action dated May 27, 2021, in connection with corresponding CA Application No. 3,078,843; 5 pages.
Extended European Search Report dated Jun. 10, 2021, in connection with corresponding EP Application No. 18866726.5; 9 pages.

* cited by examiner

HEAT SINK, INTEGRATED CIRCUIT CHIP AND CIRCUIT BOARD

CROSS-REFERENCE TO RELATED APPLICATION

This application is a continuation of International Application No. PCT/CN2018/109421, filed on Oct. 9, 2018, which claims the priority benefit of Chinese Patent Application No. 201710936285.3, entitled "HEAT SINK, INTEGRATED CIRCUIT CHIP AND CIRCUIT BOARD," filed on Oct. 10, 2017. The content of the above identified application is incorporated herein by reference in its entirety.

FIELD

The present disclosure relates to the field of integrated circuit chip heat dissipation technology, and in particular to a heat sink, an integrated circuit chip and a circuit board with the heat sink thereof.

BACKGROUND

With the continuous development of electronic technology, electronic devices are used extensively. An electronic device emits heat during operation, and if it does not cool down in time, its normal operation will be interfered. A commonly used heat dissipation method is to integrally mount a heat sink on a circuit board, so that the heat sink is in contact with all the integrated circuit chips on the circuit board to cool them down. However, poor contact between the heat sink and some of the integrated circuit chips may cause those chips to overheat and malfunction. In addition, due to the different heights of different integrated circuit chips, in order to place the heat sink in contact with all the chips, some of the thicker chips may be damaged due to excessive mechanical pressure.

SUMMARY

The present disclosure provides a heat sink for integrated circuit chips and circuit boards, and circuit chips and circuit boards having the same.

In one aspect of certain embodiments of the present disclosure, a heat sink is provided for integrated circuit chips. The heat sink includes a base plate and a plurality of fins connected to the base plate. The base plate includes a first segment, a second segment and a third segment connected in series. The first segment and the third segment extend obliquely upward relative to the second segment.

Further, in some embodiments, the plurality of fins are arranged in parallel. In some embodiments, the plurality of fins are spaced.

In some embodiments, a top end of one of the plurality of fins includes a handle. In some embodiments, the fin with the handle is connected to the second segment of the base plate.

In some embodiments, the thickness of the second segment of the base plate is greater than the thickness of the first segment and the third segment.

In some embodiments, the base plate and the plurality of fins are made of metal. In some embodiments, the metal is one of nickel, aluminum, iron, and copper.

Another aspect of the present disclosure provides an integrated circuit chip. The integrated circuit chip includes an integrated circuit chip body, and a heat sink as described above. The heat sink is coupled to the integrated circuit chip body.

In some embodiments, the integrated circuit chip body includes a silicon wafer and a metal dielectric layer over the silicon wafer; and the second segment of the base plate is coupled to the metal dielectric layer.

In some embodiments, the metal dielectric layer is coated with a nickel layer; and the second segment of the base plate is coupled to the nickel layer.

In some embodiments, the metal dielectric layer is formed as a cap encapsulating the silicon wafer.

In some embodiments, the integrated circuit chip body includes a silicon wafer and a plastic cover; and the second segment of the base plate is coupled to the plastic cover.

Another aspect of the present disclosure provides a circuit board. The circuit board includes a first surface; a second surface opposite to the first surface; and at least one integrated circuit chip as described above. The at least one integrated circuit chip is mounted on the first surface of the circuit board.

In some embodiments, the circuit board further includes a second heat sink as described above. The second heat sink is mounted on the second surface of the circuit board, and the second heat sink corresponds to the at least one integrated circuit chip.

In some embodiments, a second segment of a base plate of the second heat sink is connected to the second surface of the circuit board.

In some embodiments, the circuit board further includes a heat conducting channel for conducting heat from the at least one integrated circuit chip to the second heat sink.

The circuit board provided by the present disclosure has a heat sink attached to each integrated circuit chip. Compared with the method of affixing a single heat sink on the circuit board, the present disclosure may individually dissipate heat from each integrated circuit chip on the circuit board, so that each chip may be fully matched with the heat sink, thereby improving the heat dissipation efficacy. Since each of the heat sinks is only attached to a single integrated circuit chip, it avoids the problem of damaging certain chips due to uneven and excessive pressure.

The above general description and the following detailed description are intended to be illustrative and not restrictive.

BRIEF DESCRIPTION OF THE DRAWINGS

The present disclosure can be more clearly understood from the following drawings, in which.

DETAILED DESCRIPTION OF THE EMBODIMENTS

Figure 1:
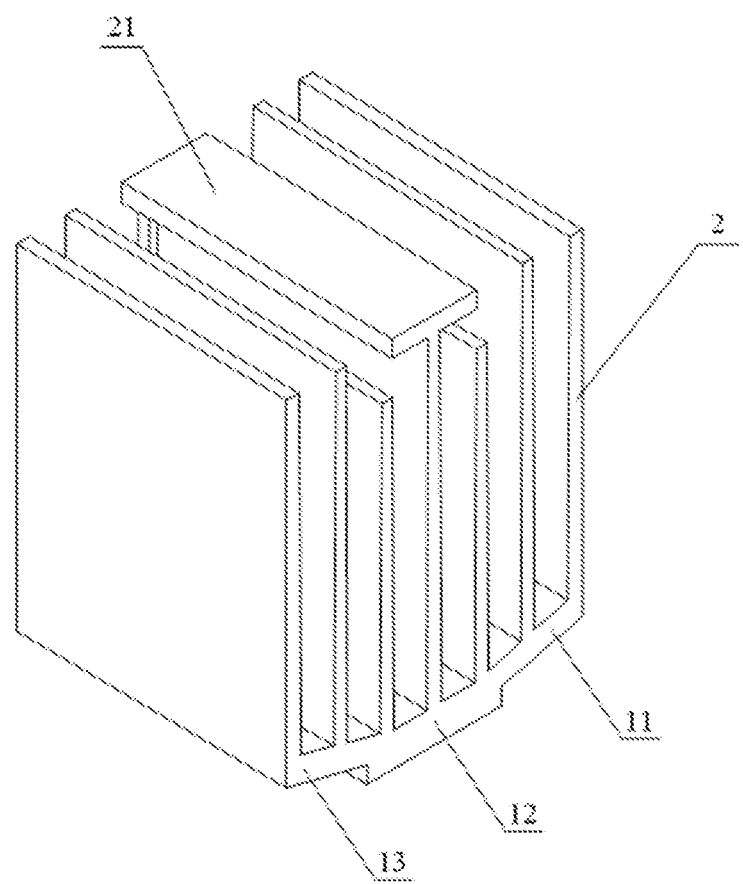
FIG. 1 is a perspective view of a heat sink according to an embodiment of the present disclosure.

Exemplary embodiments of the present disclosure will be described in more detail below with reference to the accompanying drawings. While the exemplary embodiments are shown in the drawings, it should be understood that they are not to be construed as limiting. Rather, these embodiments are provided so that this disclosure will be more fully understood, and the scope of the disclosure may be fully conveyed to those skilled in the art. It should be noted that the embodiments of the present disclosure and the features of the embodiments may be combined with each other without conflict. The disclosure will be described in detail below with reference to the drawings in conjunction with the embodiments.

Unless otherwise defined, all the technical and scientific terms used herein have the same or similar meanings as generally understood by one of ordinary skill in the art. As described herein, the terms used in the specification of the present disclosure are intended to describe example embodiments, instead of limiting the present disclosure. The term "and/or" used herein includes any suitable combination of one or more related items listed.

It should also be understood that, for the convenience of description, the size of various parts shown are not drawn to scale.

Cooling multiple heat sources with a single heat sink is an attractive option, but it can create critical design issues. For example, assume the cooling of two chips on one circuit board with one heat sink, if the height of the first chip is 1 mm and the height of the second chip is 2 mm. One heat sink may contact one chip, but not the other. Or, the heat sink may contact both chips, but in a tilted orientation. In either case, poor contact would be the result, creating a serious thermal issue. One approach is to provide separate heat sinks for each individual chip.

Figure 2:
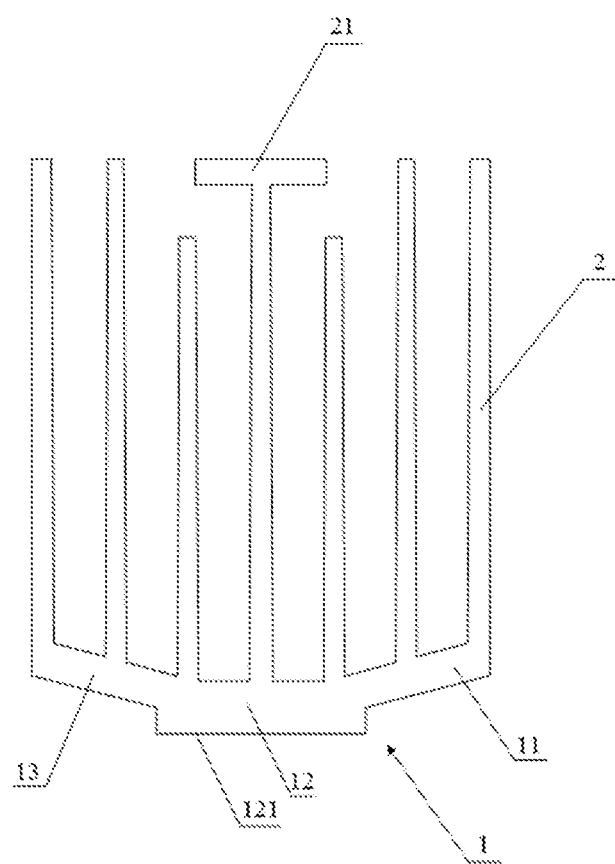
FIG. 2 is a side view of a heat sink according to an embodiment of the present disclosure.
Figure 3:
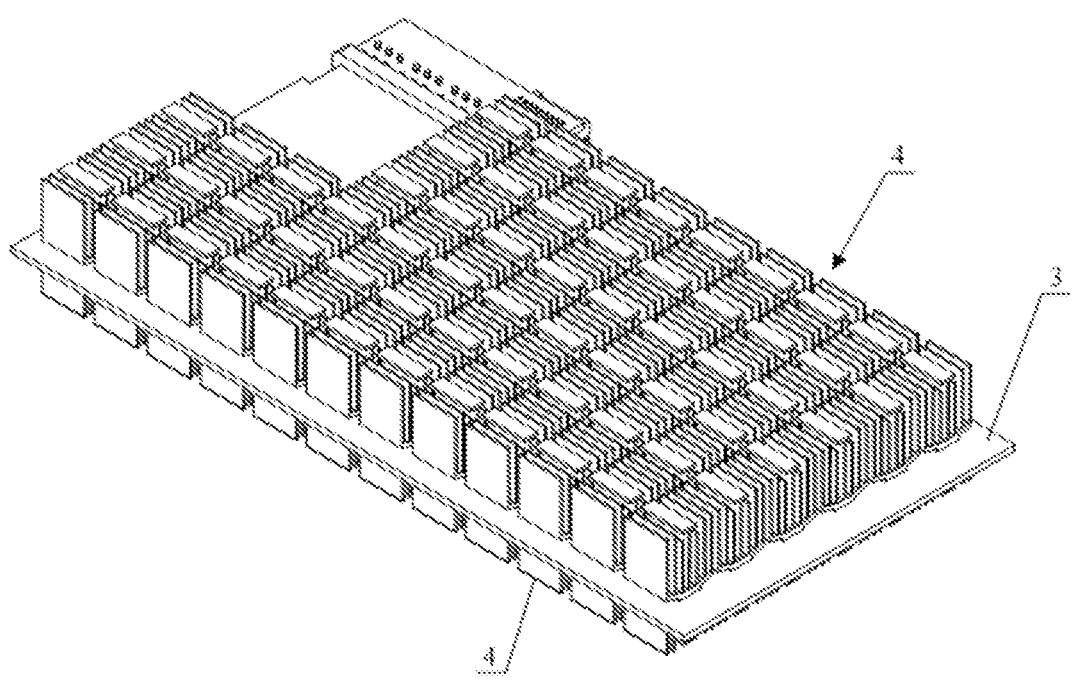
FIG. 3 is a perspective view of a circuit board according to an embodiment of the present disclosure.
Figure 4:
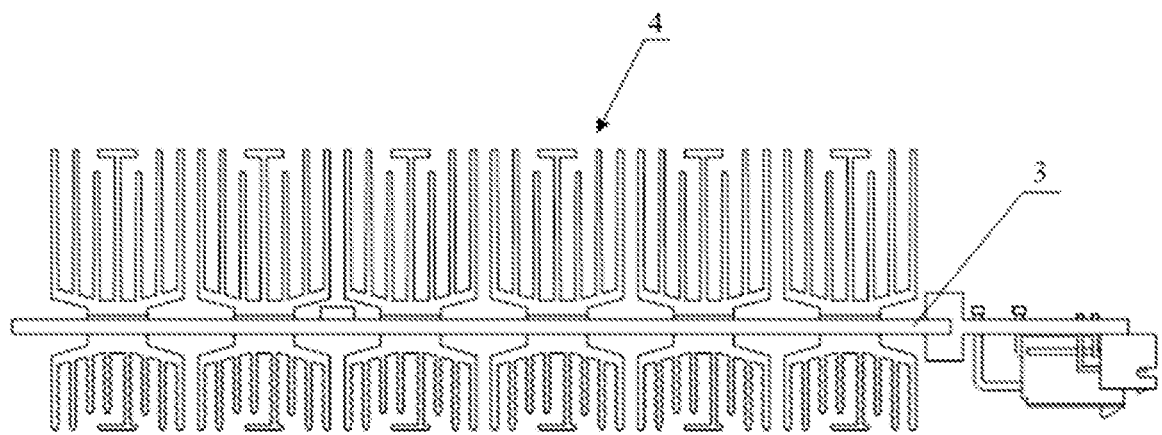
FIG. 4 is a side view of a circuit board according to an embodiment of the present disclosure.
Figure 5:
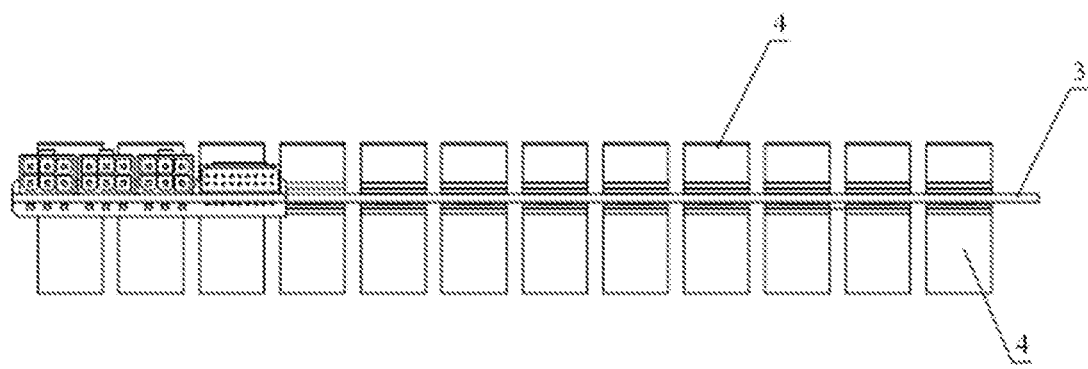
FIG. 5 is a front elevational view of a circuit board according to an embodiment of the present disclosure.
Figure 6:
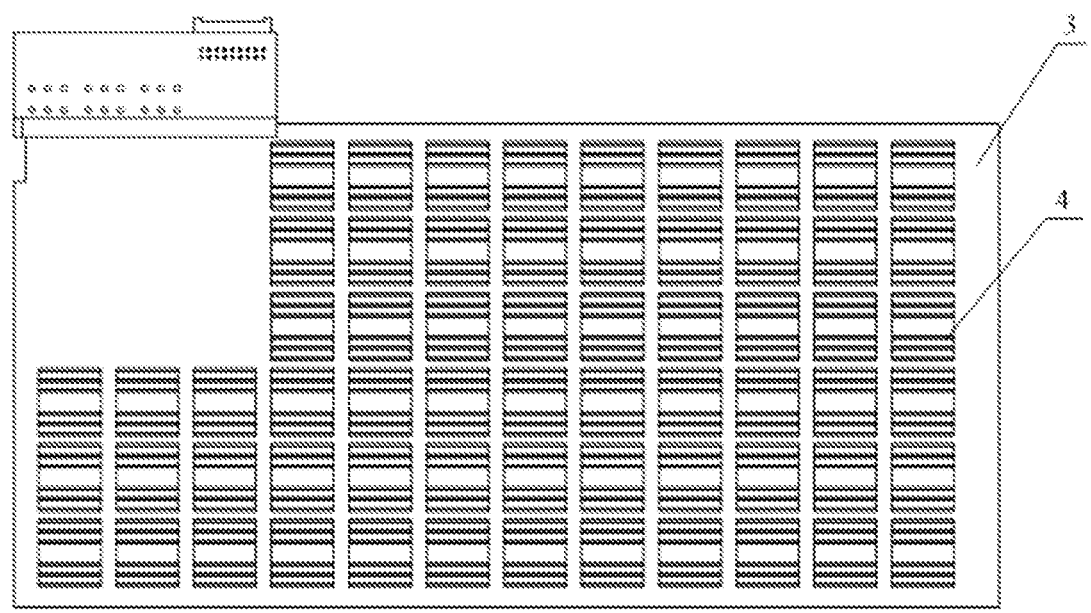
FIG. 6 is a bottom view of a circuit board according to an embodiment of the present disclosure.

Referring to FIG. 1 and FIG. 2, an exemplary construction of the heat sink is shown. The heat sink is used to dissipate heat from a single integrated circuit chip. As shown, the heat sink includes a base plate 1 and a plurality of fins 2.

The base plate 1 may include a first segment 11, a second segment 12, and a third segment 13 that are sequentially connected, the first segment 11 and the third segment 13 are configured obliquely upward (relative to the state shown in FIG. 1) with respect to the second segment 12. The specific angle of the tilt may be determined according to a specific scenario, which is not limited by this embodiment. The base plate 121 of the second segment 12 is for attaching the heat sink to an integrated circuit chip.

The number of fins 2 may be one or more. The plurality of fins 2 are connected to the top surface of the base plate 1 (the upper surface shown in FIGS. 1 and 2). Specifically, the plurality of fins 2 may be connected to the first segment 11, or may be connected to the second segment 12, or may be connected to the third segment 13. Of course, multiple fins may be connected to segment 11, segment 12, and segment 13. The specific arrangement of the fins 2 may be determined according to a specific scenario. The present disclosure is not limited to a specific arrangement. In certain embodiments, the plurality of fins 2 may be arranged in parallel, and they may be arranged at equal intervals. In one embodiment, the fins 2 include seven fins and are arranged in parallel at equal intervals. The heights of the fins 2 may vary depending on the designs of the circuit board. For example, the plurality of fins 2 may have varied heights so that the integrated circuit chip and the heat sink can fit into a designated space.

In one embodiment, the bottom surface 121 of the second segment 12 of the base plate 1 may be attached to a corresponding integrated circuit chip, and the heat generated during the operation of the integrated circuit chip is transferred to the base plate 1 and the fins 2 through the second segment 12, thereby cooling the integrated circuit chip.

Note that the heat sink of the present disclosure may be used to dissipate heat from a single integrated circuit chip.

In certain embodiments, a heat sink may be attached to each integrated circuit chip of the circuit board. Compared with the method of affixing a single heat sink on the entire circuit board, the heat sinks in the present disclosure may individually dissipate heat from each integrated circuit chip on the circuit board, so that each chip is fully matched with the heat sink, thereby further improving the heat dissipation efficacy. Furthermore, since each of the heat sinks is only attached to a single integrated circuit chip, it avoids the problem of damaging certain chips due to uneven and excessive pressure.

In certain embodiments, in order to facilitate the handling of the heat sink, a handle 21 may be provided at the top end of one of the fins 2 (the upper end shown in FIGS. 1 and 2). In certain embodiments, the handle 21 may be a sheet or an annular body connected to the top end of the fin 2. In one embodiment, a handle 21 is provided at the top end of one of the fins 2 connected to the second segment 12.

In certain embodiments, since the entire heat sink may be attached to the integrated circuit chip through the second segment 12, and the second segment 12 serves as the mounting base of the entire heat sink, the thickness of the second segment 12 may be greater than the first segment 11 and the third segment 13, ensuring the structural stability of the heat sink.

In certain embodiments, the base plate 1 may include a metal body and a plating layer deposited on the metal body. Specifically, the metal body may be made of a metal material having good thermal conductivity such as aluminum, iron, or copper; and the plating layer may be nickel or the like. The structure not only offers good thermal conductivity, but also improves corrosion resistance and aesthetic appeals.

In certain embodiments, the fin 2 may also include a metal body and a plating layer that is deposited on the metal body. The implementation can be referred to the implementation process of the base plate 1, which is not described herein again.

In summary, in certain embodiments, a heat sink may be constructed to be attached to each integrated circuit chip on a circuit board to dissipate heat from each individual chip. Each chip is fully matched with the heat sink, thereby further improving the heat dissipation efficacy.

Certain embodiments may provide an integrated circuit chip including a chip body and any of the above heat sinks. The heat sink is connected to the integrated circuit chip body. For the specific structure of the heat sink, refer to the foregoing description, which is not described herein again.

In certain embodiments, the integrated circuit chip does not have a plastic cover. In this case, a metal dielectric layer may be laid on the wafer silicon of the integrated circuit chip body, and the second segment of the base plate is connected to the metal dielectric layer. In certain implementations, the metal dielectric layer may be composed of a single layer, or two or more metal dielectric sublayers. The specific number of sublayers of the metal dielectric layer is not limited in the present disclosure. The metal material of the metal dielectric layer or sublayers may be a conventional connecting metal such as tin or the like, and the multiple metal dielectric sublayers may be joined by soldering, gluing, or other known methods to those skilled in the art. Alternatively, the metal dielectric layer may be fabricated as a metal outer casing through which the integrated circuit chip body is packaged. In one embodiment, the metal dielectric layer may have 3 sublayers.

Further, in certain embodiments, a nickel layer may be laid on the metal dielectric layer, and the second segment 12 of the base plate is connected to the nickel layer. In a certain implementation, the second segment 12 of the base plate 1 may be soldered to the nickel layer using metal tin or the like.

In certain other embodiments, the integrated circuit chip is packaged with a plastic cover. The heat sink may be connected to the plastic cover of the integrated circuit chip. In certain implementations, the second segment 12 of the base plate 1 may be soldered to the plastic cover of the integrated circuit chip using metal tin or the like.

Since the heat sink has the properties in the foregoing description, the integrated circuit chip having the heat sink has the same thermal dissipation properties.

Referring to FIGS. 3 to 6, certain embodiments provide a circuit board, including a circuit board 3, and any of the integrated circuit chips described above. The integrated circuit chips are connected to the first surface of the circuit board (the top surface shown in FIG. 3 and FIG. 4), and a heat sink 4 is attached to each of the integrated circuit chips. The implementation of the integrated circuit chips can be referred to the foregoing description, which is not described herein again.

It should be noted that the heat sink of the present disclosure may be used to dissipate heat from a single integrated circuit chip. In certain embodiments, a heat sink may be attached to each integrated circuit chip of the circuit board. Compared with the method of affixing a single heat sink on the circuit board, the present disclosure may individually dissipate heat from each integrated circuit chip on the circuit board, so that each chip is fully matched with the heat sink, thereby further improving the heat dissipation efficacy. Since each of the heat sinks is only attached to a single integrated circuit chip, it avoids the problem of damaging certain chips due to uneven and excessive pressure.

Further, in certain embodiments, the heat sinks 4 may be mounted to the second surface (the bottom surface shown in FIG. 3 and FIG. 4) of the circuit board 3 opposite to the first surface, and the heat sinks 4 may have a one-to-one corresponding relationship with the integrated circuit chips on the first surface of circuit board in their positions.

In certain embodiments, the second segment 12 of the base plate in the heat sink 4 may be connected to the second surface of the circuit board 3 using tin soldering, so that heat from the copper layer of the circuit board 3 or the pins of the corresponding integrated circuit chip can be further dissipated to the heat sinks through the heat conduction channels of the circuit board 3.

In the above embodiments, the heat sinks are connected to both the first surface and the second surface of the circuit board, further improving heat dissipation efficacy.

In certain embodiments, the circuit board may further include heat conducting channels for conducting heat from the integrated circuit chips to the heat sinks connected to the second surface of the circuit board. For example, heat conducting channels can be stripe or band structures made of metal or other heat conducting materials and integrated within the circuit board. The heat conducting channels may be thermally coupled to the integrated circuit chips on one side of the circuit board and the heat sinks on the other side of the circuit board. These heat conducting channels may effectively conduct heat generated by the integrated circuit chips to the heat sinks for heat dissipation.

In the embodiments provided in the present disclosure, it should be understood that the disclosed device and method may be realized in other manners. It will be apparent that those skilled in the art may make modifications and variations to the disclosed embodiments without departing from the spirit and scope of the disclosure. Thus, it is intended that the present disclosure covers the modifications of the embodiments.

What is claimed is:

1. A heat sink for an integrated circuit chip, comprising:
   a base plate and a plurality of fins connected to the base plate,
   the base plate further comprises a first segment, a second segment, and a third segment that are sequentially connected; and
   the first segment and the third segment extend obliquely upward relative to the second segment;
   wherein a top end of one of the plurality of fins comprises a handle.

2. The heat sink according to claim 1, wherein the plurality of fins are arranged in parallel.

3. The heat sink according to claim 1, wherein the plurality of fins are spaced.

4. The heat sink according to claim 1, wherein the fin with the handle is connected to the second segment of the base plate.

5. The heat sink according to claim 1, wherein the thickness of the second segment of the base plate is greater than the thickness of the first segment and the third segment.

6. The heat sink according to claim 1, wherein the base plate and the plurality of fins are made of metal.

7. The heat sink according to claim 6, wherein:
   the metal is one of nickel, aluminum, iron, and copper.

8. An integrated circuit chip, comprising:
   an integrated circuit chip body; and
   a heat sink comprising a base plate and a plurality of fins connected to the base plate,
   the base plate further comprises a first segment, a second segment, and a third segment that are sequentially connected; and
   the first segment and the third segment extend obliquely upward relative to the second segment,
   wherein the heat sink is coupled to the integrated circuit chip body and a top end of one of the plurality of fins comprises a handle.

9. The integrated circuit chip according to claim 8, wherein:
   the integrated circuit chip body comprises a silicon wafer and a metal dielectric layer over the silicon wafer; and
   the second segment of the base plate is coupled to the metal dielectric layer.

10. The integrated circuit chip according to claim 9, wherein:
    the metal dielectric layer is coated with a nickel layer; and
    the second segment of the base plate is coupled to the nickel layer.

11. The integrated circuit chip according to claim 9, wherein the metal dielectric layer is formed as a cap encapsulating the silicon wafer.

12. The integrated circuit chip according to claim 8, wherein:
    the integrated circuit chip body comprises a silicon wafer and a plastic cover; and
    the second segment of the base plate is coupled to the plastic cover.

13. A circuit board, comprising:
    a first surface;
    a second surface opposite to the first surface; and
    at least one integrated circuit chip comprising an integrated circuit chip body; and
    a heat sink comprising a base plate and a plurality of fins connected to the base plate, the base plate further comprises a first segment, a second segment, and a third segment that are sequentially connected; and the first segment and the third segment extend obliquely upward relative to the second segment, wherein the heat sink is coupled to the integrated circuit chip body, wherein the at least one integrated circuit chip is mounted on the first surface of the circuit board and a top end of one of the plurality of fins comprises a handle.

14. The circuit board according to claim 13, further comprising a second heat sink comprising a base plate and a plurality of fins connected to the base plate, the base plate of the second heat sink further comprises a first segment, a second segment, and a third segment that are sequentially connected; and the first segment and the third segment extend obliquely upward relative to the second segment, wherein the second heat sink is mounted on the second surface of the circuit board, and the second heat sink corresponds to the at least one integrated circuit chip.

15. The circuit board according to claim 14, wherein a second segment of a base plate of the second heat sink is connected to the second surface of the circuit board.

16. The circuit board according to claim 15, wherein the circuit board further comprises a heat conducting channel for conducting heat from the at least one integrated circuit chip to the second heat sink.

* * * * *